United States Patent
Sun (10) Patent No.: US 10,777,247 B1
(45) Date of Patent: Sep. 15, 2020

(54) SPIN-BASED STORAGE ELEMENT

(71) Applicant: INTERNATIONAL BUSINESS MACHINES CORPORATION, Armonk, NY (US)

(72) Inventor: Jonathan Zanhong Sun, Shrub Oak, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/363,202

(22) Filed: Mar. 25, 2019

(51) Int. Cl.
*G11C 11/00* (2006.01)
*G11C 11/16* (2006.01)
*H01L 43/02* (2006.01)
*H01L 27/22* (2006.01)
*H01L 43/10* (2006.01)

(52) U.S. Cl.
CPC ........ *G11C 11/161* (2013.01); *G11C 11/1673* (2013.01); *G11C 11/1675* (2013.01); *H01L 27/222* (2013.01); *H01L 43/02* (2013.01); *H01L 43/10* (2013.01)

(58) Field of Classification Search
CPC ... G11C 11/14; G11C 16/0441; G11C 16/045; G11C 11/1675; G11C 11/1673; G11C 11/161; G11C 11/1659; G11C 11/16; G11C 11/15; G11C 11/54; G11C 11/005; G11C 11/401; G11C 17/16; G11C 17/165; G11C 2029/4402
USPC ................ 257/295, 421, E27.104, E29.323; 365/158, 173, 171, 200, 201, 230.03, 365/185.29, 189.07, 199, 209, 222, 225.5, 365/228, 230.07, 232, 243.5
See application file for complete search history.

(56) References Cited

U.S. PATENT DOCUMENTS

| | | | |
|---|---|---|---|
| 9,653,136 B2 | 5/2017 | Cros | |
| 9,773,540 B2 | 9/2017 | Zang et al. | |
| 10,026,431 B2 | 7/2018 | Bromberg et al. | |
| 10,102,956 B2 | 10/2018 | Cros et al. | |
| 2009/0200592 A1* | 8/2009 | Tsuchiaki | G11C 11/14 257/295 |
| 2015/0070981 A1 | 3/2015 | Kumura et al. | |
| 2015/0325278 A1 | 11/2015 | Bauer et al. | |
| 2018/0114898 A1 | 4/2018 | Lee | |

FOREIGN PATENT DOCUMENTS

WO  2009058634 A1  5/2009

OTHER PUBLICATIONS

Alaghi, A. et al., "Survey of Stochastic Computing", May 2013, vol. 12, No. 2s, Article 92, ACM Transactions on Embedded Computing Systems, pp. 92:1-92:19.
Gupta, S. et al., "Deep Learning with Limited Numerical Precision", 2015, vol. 37, Proceedings of the 32 nd International Conference on Machine Learning, Lille, France, JMLR: W&CP, pp. 1-10.

\* cited by examiner

*Primary Examiner* — Thong Q Le
(74) *Attorney, Agent, or Firm* — Cantor Colburn LLP; Vazken Alexanian (57) ABSTRACT

A technique relates to a magnetic device. A configuration in a memory layer of the magnetic device is adjusted, the configuration affecting stochastic fluctuations in a free magnetic layer of a magnetic tunnel junction coupled to the memory layer. The stochastic fluctuations are used to define a random number according to the configuration in the memory layer.

20 Claims, 8 Drawing Sheets

ADJUST A POSITION/CONFIGURATION OF A DOMAIN WALL IN A MEMORY LAYER OF THE MAGNETIC DEVICE, THE POSITION/CONFIGURATION OF THE DOMAIN WALL AFFECTING FLUCTUATIONS IN A MAGNETIC TUNNEL JUNCTION OF THE MEMORY LAYER  502

USE THE FLUCTUATIONS TO DEFINE A RANDOM NUMBER ACCORDING TO THE ADJUSTING OF THE POSITION/CONFIGURATION OF THE DOMAIN WALL IN THE MEMORY LAYER  504

CAUSE, BY THE CONTROLLER, A WRITE OPERATION TO ADJUST A POSITION/CONFIGURATION OF A DOMAIN WALL IN A MEMORY LAYER OF A MAGNETIC DEVICE, THE POSITION OF THE DOMAIN WALL AFFECTING FLUCTUATIONS IN A MAGNETIC TUNNEL JUNCTION OF THE MEMORY LAYER 602

USE, BY THE CONTROLLER, THE FLUCTUATIONS TO DEFINE A RANDOM NUMBER ACCORDING TO ADJUSTING OF THE POSITION/CONFIGURATION OF THE DOMAIN WALL IN THE MEMORY LAYER 604

FIG. 7

SPIN-BASED STORAGE ELEMENT

BACKGROUND

The present invention generally relates to device structures and fabrication methods for spintronic devices compatible to back-end integration with semiconductor devices, and more specifically, to spin-based storage elements configured and arranged to provide a stochastically represented multiple state memory function.

Tunnel magnetoresistance (TMR) is a magnetoresistive effect that occurs in a magnetic tunnel junction (MTJ) storage element consisting of two ferromagnets separated by a thin insulator. If the insulating layer is thin enough, for example, a few nanometers, electrons can tunnel from one ferromagnet into the other. The digital state in an MTJ is represented by its tunnel resistance. When the two ferromagnet's moments align in parallel with each other, the resistance registers its minimum value, and when they align in antiparallel, its maximum.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. Data is stored in MRAM as magnetic states or characteristics (e.g., magnetization direction, texture of magnetization direction over the area of the MTJ, etc.) instead of electric charges. In one configuration, each MRAM cell includes a transistor, an MTJ device for data storage, a bit line, and a word line. As described above, the MTJ's electrical resistance will be high or low based on the relative magnetic states of certain MTJ layers.

SUMMARY

Embodiments of the invention are directed to a method for controlling a magnetic device. A non-limiting example of the method includes adjusting a configuration in a memory layer of the magnetic device, the configuration affecting stochastic fluctuations in a free magnetic layer of a magnetic tunnel junction coupled to the memory layer, and using the stochastic fluctuations to define a random number according to the configuration in the memory layer.

Embodiments of the invention are directed to a method for operating a controller. A non-limiting example of the method includes causing, by the controller, a write operation to adjust a configuration of a memory layer of a magnetic device, the configuration affecting stochastic fluctuations in a magnetic tunnel junction of the magnetic device. Also, the method includes using, by the controller, statistical properties of the stochastic fluctuations in a time sequence to define a physical number according to the configuration in the memory layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, superparamagnetic tunnel junctions are spintronic nanodevices composed of a high-stability pinned nanomagnet and a low-stability "free" nanomagnet, separated by a tunnel oxide layer. The structure of superparamagnetic tunnel junctions is similar to the magnetic tunnel junctions used as the basic memory elements in MRAMs. In a cell intended for use as a memory, the free magnet has two stable states, parallel (P) and antiparallel (AP) relative to the pinned layer. Through the tunnel magnetoresistance effect, the electrical resistance of the junction in the AP state is higher than the resistance in the P state. This effect is traditionally measured through the tunnel magnetoresistance (TMR) coefficient. Unlike the case of MRAMs, for which the magnetization direction of the free magnet is highly stable and can be switched only by proper external action, the magnetization direction of the superparamagnetic free magnet spontaneously switches between its two stable states due to low stability relative to thermal fluctuations. Here, no bias or perturbation scheme is required to provoke these random fluctuations, only temperature. The resistance can be measured by applying a small current through the junction. Depending on the device design and its intended operation, a superparamagnetic MTJ can either assume two states with rapid and stochastic fluctuations in between, or it could similarly have rapid thermal fluctuations for any orientations in between the P and AP states. Both create a resistive signal that is stochastic in nature and can be read out digitally as a stochastic sequence of 0s or 1s, the so-called Bernoulli sequence, with its mean-value and life-time representing the digital state and operating speed of the device according to embodiments of the invention.

Turning now to an overview of the aspects of the invention, one or more embodiments of the invention describes a new class of spin-based magnetic memory elements that allow for a stochastically distributed multiple state memory function using superparamagnetic tunnel junctions. The memory element includes a domain wall that is shifted during a write operation. The memory element can be written by spin-transfer-torque (STT) and can be read out stochastically, with both accomplished using conventional complementary metal-oxide-semiconductor (CMOS) circuitry. The memory device is designed for power efficient operation for obtaining a high-quality stochastic sequence with controlled characteristics. The high-quality stochastic sequence can be used for example for bit stream information processing that involves large dynamic-range variables with a reduced requirement for least-significant digit accuracy, such as those needed in hardware-accelerated deep neuromorphic computation systems.

As one illustrative application of this type of stochastic memory devices, consider the representation of physical quantities in the natural world. Those often need to be digitally represented with a wide dynamic range covering many orders of magnitude such as $10^2$, $10^3$, $10^4$, etc. Examples of such signals include audio signal levels of human hearing and light intensity for human visual perception. For high efficiency representation of such signals in a finite-state digital system for real-time signal processing, it is often desirable to have these limited number of states be more evenly distributed on a log scale and not on a linear scale according to embodiments of the invention.

Conventional digital memories have their states distributed evenly on a linear scale of numbers, from the least significant bit to the most. When used for high-speed, relatively low precision signal processing, this is often inconvenient and inefficient. However, a very large bit-depth would be used to cover the many orders of magnitude changes of the variables. Various strategies have been used to mitigate this limitation. Embodiments of the invention are configured to invoke the concept of stochastic computation. In this approach, embodiments of the invention are configured to use the mean of its probabilistic distribution of a digital variable to represent an analog quantity (e.g., the position of the domain wall), whose value is to be represented and have signal processing over a wide dynamic range. This is similar to the concept, well-established in digital signal processing, based on an over-sampling system's "Sigma-Delta conversion".

Recently, over sampling has seen use in enhancing computational efficiencies in deep neuro-network signal processing. In such applications, the entropy is introduced via standard software-based pseudo-random number generators. Even with such relatively inefficient process, a significant gain in performance has been demonstrated over brute-force direct matrix sum operation in pure digital form. A hardware based logarithmically distributed stochastic memory element provides more direct performance gain for such digital signal processing algorithms, by using embodiments of the invention. Embodiments of the invention describe memory devices using a spin-based device concept that allows analog storage of a variable (e.g., the position of a domain wall in a base layer) within a single memory cell. The memory cell has probabilistic read out representing the analog variable that (generally) carries a log-linear relationship between its non-volatilely stored and stochastically read-out value (e.g., reading out MTJ resistance values), and the input-writing strength. According to embodiments of the invention, this type of memory cell excels in representing a wide dynamic range variable with a limited number of states and/or clock cycles. The memory cell can be used in biologically inspired deep learning network systems, where the coupling matrix's dynamic range is important for efficient learning. The above example application is for explanation purposes, and it will be appreciated that embodiments of the invention can be implemented in wide range of applications.

Figure 1:
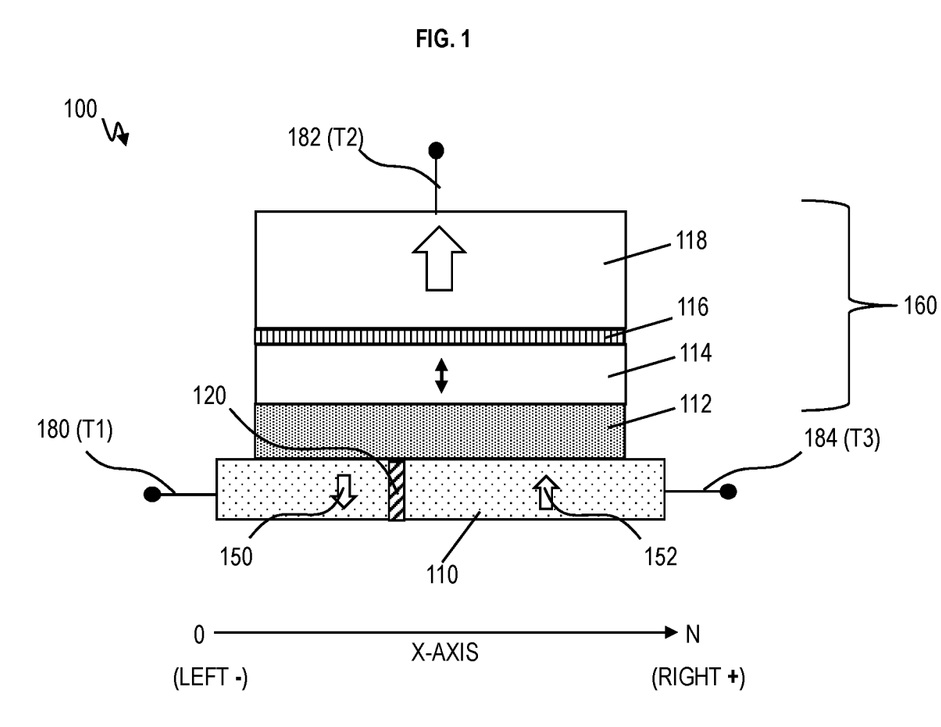
FIG. 1 depicts a cross-sectional view of a spin-based magnetic device according to embodiments of the invention.

Turning now to a more detailed description of aspects of the present invention, FIG. 1 depicts a cross-sectional view of a spin-based magnetic device 100 according to embodiments of the invention. The spin-based magnetic device 100 includes a base layer 110. In embodiments of the invention, the base layer 110 is a ferromagnetic thin film with anisotropy energy and domain-wall pinning potential sufficiently strong to maintain its magnetic configuration at ambient temperature for extended time (such as 10 years). Example ferromagnetic materials can include iron, nickel, cobalt, and their alloys. These materials and memory mechanisms can be the same as used in magnetic hard-disk drives, for example.

The base layer 110 includes a transition region having a domain wall 120. The domain wall 120 is an interface separating magnetic domains. The domain wall 120 is where the magnetic moment rotates from one magnetic domain having moment 150 (e.g., downward arrow) to another magnetic domain having moment 152 (e.g., upward arrow). A magnetic domain is a region within a magnetic material in which the magnetization is in a relatively uniform direction relative to that of a domain-wall. This means that the local magnetic moments are aligned with one another and they point substantially in the same direction. The domain wall 120 is sufficiently pinned so as to not move its position within the lifetime requirement for memory, which is a similar requirement for disk-drive media use as well. The location of the domain wall 120 in base layer 110 determines the net amount of coupling field (e.g., a dipolar magnetic field) influence the base layer 110 has on its adjacent magnetic structures, such as free magnetic layer 114, in one magnetic direction (e.g., upward) versus the other magnetic direction (e.g., downward). When the domain wall 120 is shifted more to the right than left, the downward magnetic orientation/moment 150 influences the free magnetic layer 114 and causes the magnetic moment of the free magnetic layer 114 to be changed to match the downward magnetic orientation/moment 150. Similarly, when the domain wall 120 is shifted more to the left than right, the upward magnetic orientation/moment 152 influences the free magnetic layer 114 and causes the magnetic moment of the free magnetic layer 114 to be changed to match the upward magnetic orientation/moment 152.

Figure 2:
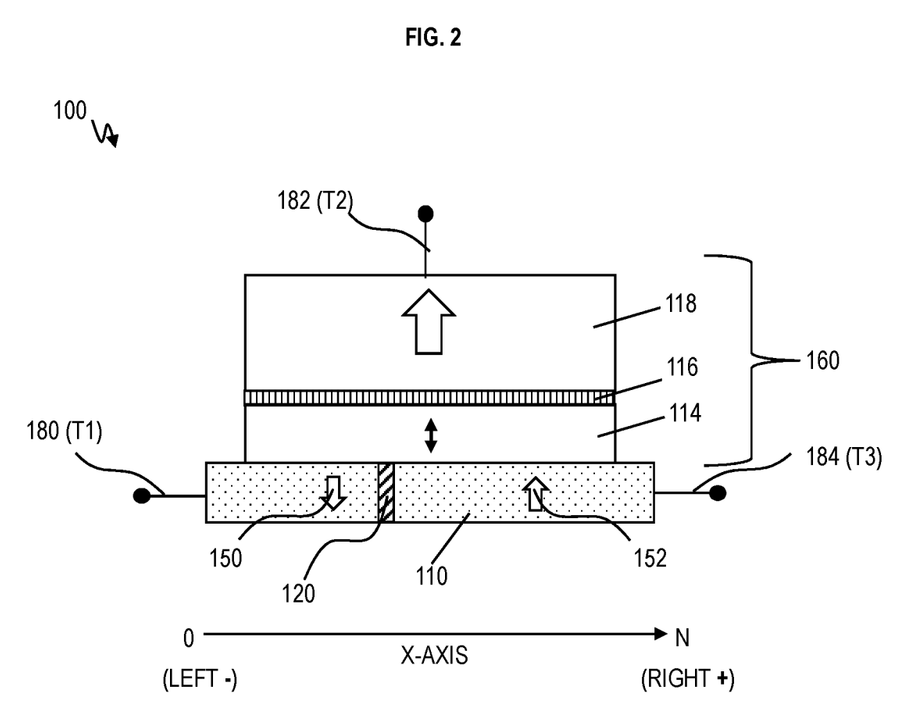
FIG. 2 depicts a cross-sectional view of a spin-based magnetic device according to embodiments of the invention.

Intervening layer 112 is an optional layer for removing the strong ferromagnet-to-ferromagnet exchange coupling between base layer 110 and free magnetic layer 114, thus allowing free magnetic layer 114 to be coupled (only) via a weaker, longer range field, such as dipolar field, a Ruderman-Kittel-Kasuya-Yosida (RKKY) type of relatively weak exchange from base layer 110, and/or a combination. The intervening layer 112 can, for example, be a thin layer of metal or metal alloy. The intervening layer 112 can be a good conductor or a poor conductor. Example materials of the intervening layer 112 can include AgZn, and Ta, a bad conductor ("bad-metal") such as TaOx, and/or a combination. Other example materials of the intervening layer 112 can include Ru, Ir, ultra-thin MgO, and other alloys and compounds known to exhibit exchange-like coupling across. The single material and/or combination of materials for intervening layer 112 is to be optimized for crystalline growth-related structural transition, such as for a common (fcc) symmetry often seen in materials used for base layer 110, to that of a (bcc) crystalline symmetry required for high magnetoresistance tunnel junction formed by tunnel barrier layer 116. The tunnel barrier layer 116 can be cubic oxide, such as MgO. Other example materials of the tunnel barrier layer 116 include $AlO_x$, $TaO_x$, and other known tunnel barriers, including vacuum spacing. Although the intervening layer 112 is present in FIG. 1, it should be appreciated that the intervening layer 112 may or may not be present in some cases. FIG. 2 depicts a cross-sectional view of the spin-based magnetic device 100 according to embodiments of the invention. FIG. 2 includes the same layers as FIG. 1 except the intervening layer 112 is removed from FIG. 2. In FIG. 2, the base layer 110 is in direct contact with the free magnetic layer 114.

In FIGS. 1 and 2, free magnetic layer 114 is the free layer of the magnetic tunnel junction structure 160. The free magnetic layer 114 is designed to have its uniaxial anisotropy axis substantially collinear with that of base layer 110, and to have its related anisotropy energy sufficiently low so as to allow for rapid fluctuations of its magnetic moment (represented by double arrows because the magnetic moment fluctuates) at ambient temperature in the so-called superparamagnetic limit. This usually implies a uniaxial anisotropy energy barrier height $E_b \ll 20 \cdot k_B \cdot T$, where T is the ambient temperature and $k_B$ is Boltzmann constant. Superparamagnetism is a form of magnetism which appears in small ferromagnetic or ferrimagnetic nanoparticles. In sufficiently small nanoparticles, magnetization can randomly flip direction under the influence of temperature. The speed of such fluctuation is characterized in observational terms by an auto-correlation time of the moment's time-dependence (and similarly the auto-correlation time for the MTJ's resistance fluctuation in time). In the absence of an external magnetic field or other uni-directional energy-bias, when the time used to measure the magnetization of the nanoparticles is much longer than the auto-correlation time, their magnetization appears to average to zero; they are said to be in the superparamagnetic state. In this state, an external magnetic field can magnetize the nanoparticles, similarly to a paramagnet. In the device design presented herein, the free magnetic layer 114 is intended for operation under superparamagnetism. The free magnetic layer 114 is a magnetic body designed to be superparamagnetic. Superparamagnetic magnets can be achieved by reducing the thermal activation energy below that of about 20 $k_B T$ by controlling its anisotropy energy density, its shape and volume, and/or in combination. These can be achieved with most magnetic materials such as Fe, Co, Ni, Mn, and their alloys and compounds sometimes including other elements, such as oxygen and/or nitrogen.

The tunnel junction is formed by introducing the tunnel barrier layer 116 between two electrodes, free magnetic layer 114 and reference layer 118. The reference magnetic layer 118 has its interface magnetic moment pointing to a fixed direction (represented by a large upward arrow) for reference to the free-layer orientation during read out. Free magnetic layer 114, tunnel barrier layer 116, and reference magnetic layer 118 constitute a magnetic tunnel junction 160 for resistive read out of the free magnetic layer's (114) magnetic orientation state (whether up or down or any states in between). The reference magnetic layer 118 can be engineered to have an artificially antiferromagnetically coupled layered structure to minimize and/or control its dipolar field's effect on the free magnetic layer 114.

Figure 4A:
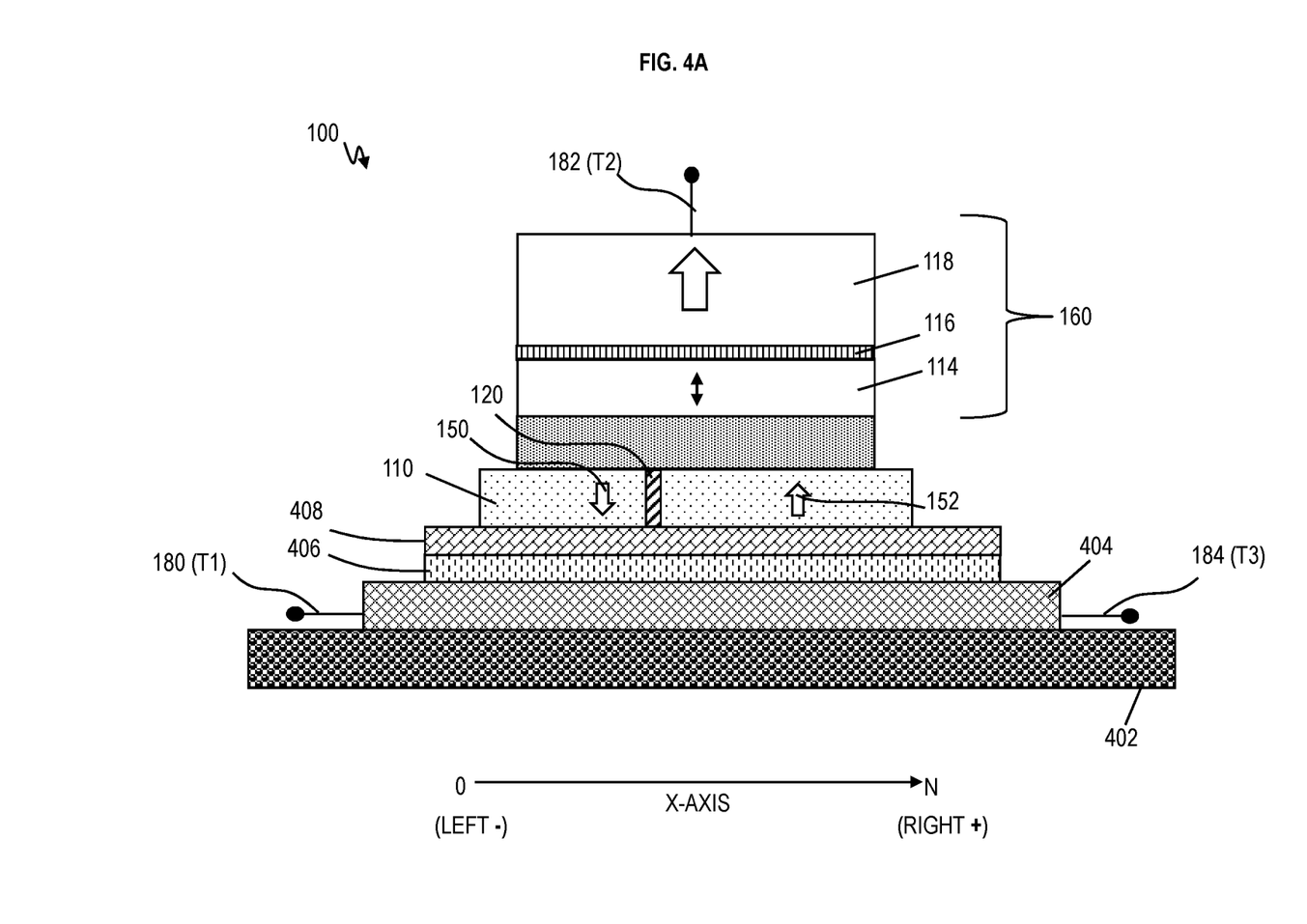
FIG. 4A depicts a cross-sectional view of a spin-based magnetic device according to embodiments of the invention.
Figure 4B:
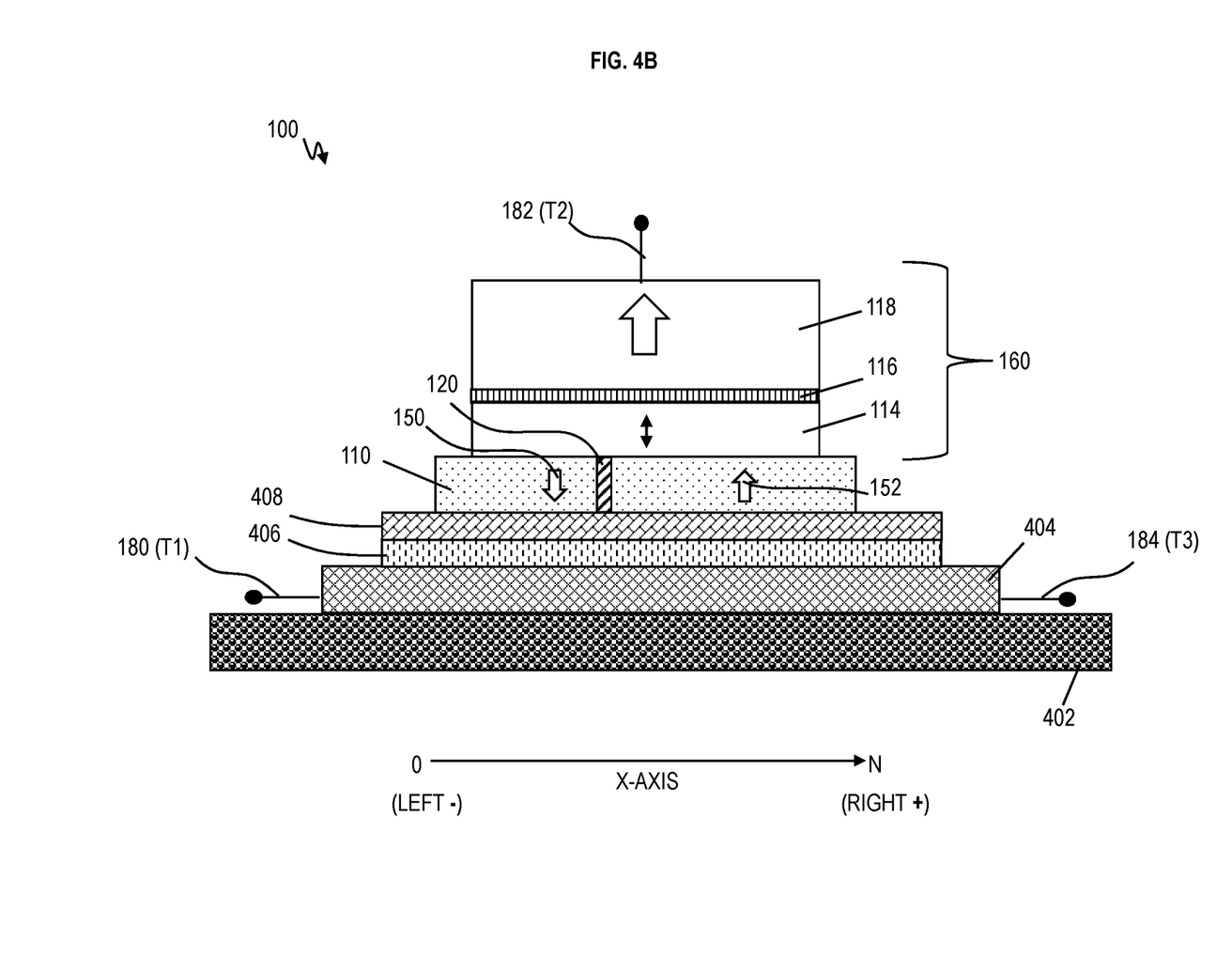
FIG. 4B depicts a cross-sectional view of a spin-based magnetic device according to embodiments of the invention.

The domain-wall memory layer 110, together with the MTJ 160 combine to form the device 100, where terminals 180, 182, and 184 are operatively connected as illustrated in FIGS. 1 and 2. Terminals 180 (T1) and 184 (T3) are coupled to the base layer 110, for example, at opposite ends. Terminal 182 (T2) is coupled to the reference magnetic layer 118 of the MTJ device 160. The terminals 180, 182, and 184 are used for inputting/outputting signals and making measurements as discussed further in FIG. 3. FIG. 4A depicts a cross-sectional view of the spin-based magnetic device 100 in FIG. 1 with additional layers according to embodiments of the invention. FIG. 4B depicts a cross-sectional view of the spin-based magnetic device 100 in FIG. 2 with additional layers according to embodiments of the invention. In FIGS. 4A and 4B, the spin-based magnetic device 100 illustrates the base layer 110 formed on support material layer 406 which is formed on conductive material layer 404, where the conductive material layer 402 is formed on a substrate 402. FIG. 4A includes the same layers as FIG. 1 and FIG. 4B includes the same layers as FIG. 2. Unlike FIGS. 1 and 2, the terminals 180 (T1) and 184 (T3) are coupled to the conductive material layer 402 in FIGS. 4A and 4B.

Below the surface and/or partially on the surface of substrate 402 lies the CMOS circuit that can be built through state-of-the-art commercial fabrication processes. In some cases, the substrate 402 can be adjacent to the bottom surface of the base layer 110 in FIGS. 1 and 2 (although not shown). The conductive material layers 404, 406, and 408 can be thin layers composed of conductive materials with strong spin-orbit interactions to provide a large spin-current across the interface and into the domain-wall memory layer 110. Example materials of the support material layer 406 and 408 can include heavy-element metals and/or conductive heavy-metal oxides, such as Pt, Ta, W, IrOx, and/or WOx. Example materials of the support material layer 406 can also include a class of surface conductors with strong spin-orbit interaction called topological insulators, such as $(Bi_{0.5}Sb_{0.5})_2Te_3$.

Support material layer 406 can also be a thin layer of antiferromagnetic or ferrimagnetic insulator material, such as NiO, CoO, and/or FeCo-ferrites. Support material layer 406 is structured to transmit the spin-current generated via spin-Hall effect from charge current flowing within conductive material layer 404 from its interface with conductive material layer 404 to its interface with base layer 110. The conduction of pure spin-current across ferromagnetic or antiferromagnetic insulators has recently been well-established. A function of support material layer 406 is to prevent shunting of charge current in conductive material layer 404 by the magnetic thin film stack of base layer 110 and above, while allowing the spin-current generated by conductive material layer 404 to efficiently couple into base layer 110. In some embodiments of the invention, interceding layer 408 can be formed between support material layer 406 and base layer 110 to sever the magnetic exchange coupling at their interfaces, while preserving the ability to transport spin current from support material layer 406 into base layer 110. In such cases, interceding layer 408 can be added to facilitate spin current transport. For example, the interceding layer 408 can be made of spin-current conducting metals such as AgZn that both facilitate (bcc) film growth for the subsequent base layer 110 and allow efficient spin-current transport.

Further, in some embodiments of the invention, the support material layer 406 and interceding layer 408 can be removed, and base layer 110 can be formed directly on conductive material layer 404. Therefore, the support material layer 406 can have direct and efficient charge-current coupling with base layer 110. It could be beneficial to have direct charge current flow inside the dipole-layer material of the base layer 110, which can simply the material structure and uses charge-current in the ferromagnet to directly affect its domain wall's movement.

Figure 3:
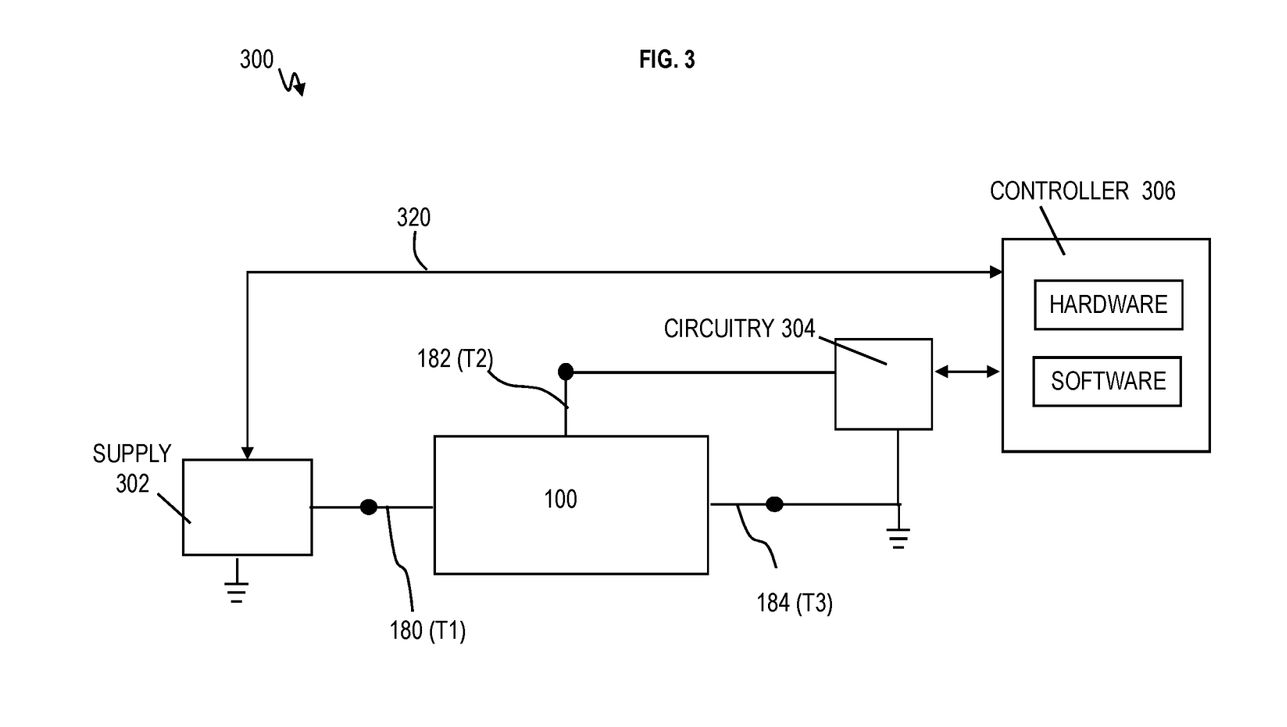
FIG. 3 depicts a system using the spin-based magnetic device according to embodiments of the invention.

FIG. 3 depicts a system 300 using the spin-based magnetic device 100 in FIGS. 1, 2, 4A, and 4B according to embodiments of the invention. A write-operation power supply 302 is operatively connected to terminal 180 (T1) of the magnetic device 100. The write power supply 302 is configured to be bipolar so as to provide write current to the magnetic device 100 to move the domain wall 120 left and right along the x-axis. For example, the power supply 302 can be designed to supply positive polarity current pulses to the magnetic device 100 such that the positive polarity current pulses incrementally move the domain wall 120 to the right (+). Similarly, the power supply 302 can be designed to supply negative polarity current pulses to the magnetic device 100 such that the negative polarity current pulses incrementally move the domain wall 120 to the left (−). The relationship between the polarity of the current pulses and the movement of the domain wall 120 could be reversed (i.e., positive polarity current pulses could move the domain wall to the left while negative polarity current pulses could move to the right). The power supply 302 can be controlled by a controller 306 and connected via connection 320. The connection 320 can fan out to neighboring systems 300 to accomplish circuit functions, where each system 300 is a memory cell. The controller 306 is configured to move the domain wall 120 to a desired position along the x-axis by, for example, controlling the number of write current pulses supplied by power supply 302. The controller 306 can also include one or more functions and elements of a computer system, such as computer system 712 depicted in FIG. 7.

The magnetic memory device 100 can be designed such that the base layer 110 (also referred to as the memory layer) takes N write pulses of a given pulse height (amplitude) to fully displace the magnetic domain wall 120 from the left (e.g., at 0 on the x-axis) to the right end (e.g., N on the a-axis), covering N levels of representative states of the memory, and/or to fully displace the domain wall 120 from the right (e.g., N on the x-axis) to the left (e.g., 0 on the x-axis). In a reverse write process, negative polarity current pulses drive the domain wall 120 in the opposite direction, thus accomplishing the control of the domain wall position or writing the specific bit. This type of writing mechanism has the added advantage of being a natural integrator of the incoming bit stream received at terminal 180. Such bit streams could be originated from other cells containing element/device 100, whereby the output (corresponding to a read-out of terminal 182) represents a stochastic signal stream, whose time-integration (with a level shift for +/− signed pulses to represent 0/1 states, for example) would naturally provide the mean-value of the digital stream.

The read-out circuitry 304 is configured to measure the resistance (e.g., ohms) of mainly the MTJ device 160 which in effect measures whether the free magnetic layer 114 has it magnetic moment parallel or antiparallel to the fixed magnetic moment of the reference magnetic layer 118. The MTJ 160 in the main contributor of the resistance measured between output terminal 182 and terminal 184 (e.g., ground). By convention, a low resistance can be denoted as a 0 (high bit) when the magnetic moments of the free magnetic layer 114 and reference magnetic layer 118 are parallel while a high resistance can be denoted by a 1 (low bit) when the magnetic moments of the free magnetic layer 114 and reference magnetic layer 118 are antiparallel. Because the free magnetic layer 114 operates under superparamagnetism, as the current pulses are input into the input terminal 180 to ultimately move the domain wall 120 to a desired position on the x-axis, the output terminal 182 outputs a series of fluctuating resistance values that can be read and threshold-discriminated to be a series of resistance highs and lows, representing the 1s and 0s (i.e., high resistance values and low resistance values measured by the measurement circuitry 304). The stochastic fluctuations (i.e., superparamagnetism) of the magnetic moment of the free magnetic layer 114 makes the magnetic device 100 a random generator producing a bit stream of 1s and 0s measured/received by the measurement circuitry 304. The controller 306 is configured to determine or compute the mean value (i.e., average) of the 1s and 0s (i.e., low resistance values and high resistance values), forming an analog output that represents the value-state of memory element/device 100. This value state can then be cascaded down to different circuit elements, some also composed of block-diagrams similar to those of element/system 300, to complete desirable functionalities. Desirable functions can include representing a certain range of an analog signal (e.g., the least-significant bit but with much better representation accuracy than a single binary bit), and/or being used as a controlled random number generator for other circuit purposes, such as providing a seed-number at any given time for hard-ware based encryption functions.

Each current pulse (whether negative or positive polarity) from power supply 302 affects whether the magnetic domain of the base layer 110 is more of a downward magnetic moment 150 or an upward magnetic moment 152, and the magnetic moment correspondingly affects the free magnetic layer 114. For example, each time the power supply 302 transmits a current pulse intended to move the domain wall 120 left or right, the magnetic field (e.g., dipolar field) causes the magnetic moment of the free magnetic layer 114 to fluctuate because of the superparamagnetism of the free magnetic layer 114, although the stochastic mean value of the fluctuations will eventually settle such that the magnetic moment of free magnetic layer 114 matches the magnetic moment (either down 150 or up 152) in base layer 110. The can be numerous fluctuations between a low resistance value and a high resistance value as measured by the measurement circuitry 304 and stored in controller 306, thereby creating a bit stream of 1s and 0s as determined by the controller 306. As such, the power supply 302 continues inputting current pulses to terminal 180 which continuously increases (adjusts) the magnetic domain strength for downward moment 150 or upward moment 152 (thereby causing the moment of the free magnetic layer 114 to continuously fluctuate) until the domain wall 120 reaches its final position on the x-axis. Even after the current pulses of the write operation stop and the domain wall 120 reaches its final position on the x-axis, the stochastic fluctuations of the magnetic moment of the free magnetic layer 114 continue for a relaxation time because of the superparamagnetism until the magnetic moment of the free magnetic layer 114 settles in a direction (e.g., downward moment or upward moment) based on the final position of the domain wall 120, thereby matching the more downward moment 150 or more upward moment 152 of the base layer 110. All of the stochastic fluctuations in the magnetic moment of the free magnetic layer 114 are measured as a sequence of high and low resistance values and collected by controller 306 in memory, to be utilized as a randomly generated number of 1s and 0s where a 1 corresponds to each low resistance value in the sequence and a 0 corresponds to each high resistance value in the sequences, thereby creating a randomly generated number (e.g., 11001010100101010). This same randomly generated number (over time) encodes the position of the domain wall 120 on the x-axis in base layer 110. The controller 306 is configured to determine the average time of the stochastic fluctuations, i.e., the stochastic mean value, as a low resistance value (e.g., 1) and a high resistance value (e.g., 0), and this average over time (10 milliseconds) of being, for example, a low resistance value (e.g., 1) more than a high resistance value (e.g., 0) is (or defines) the domain wall position of domain wall 120. In combination, system 300 forms a "cell" of one such stochastic memory element. The function of system 300 is to (1) represent its analog state by the mean-value of its stochastic fluctuations, and (2) allow change of its mean-value by receiving control-current pulses, in a naturally pulse-number integration fashion as described above. The mean value of system 300 can be read out via a time-integrating circuit (such as circuitry 304 and/or controller 306) to directly represent the end-result desired for circuit applications (such as the output signal of a neuromorphic matrix operation's sum-signal), and/or the mean value of system 300 can form the input of the next stage which could similarly contain a system 300-like element for receiving the stochastic digital sequence. With this, an entire circuit can be designed to function as a stochastic signal processor.

According to embodiments of the invention, the magnetic tunnel junction 160 is a random number generator making use of superparamagnetism, and magnetic domain wall 120 as an entity for storing information in either analog or digital form, and for controlling the superparamagnetic state of the MTJ. The combination of using the domain-wall structure to control the mean value of the stochastic fluctuation of the MTJ 160 creates a stochastic memory cell which is system 300 that functions both as a random generator at the output terminal 182 and as a multi-level, near analog storage cell.

Technical advantages and benefits of embodiments of the invention provide a magnetic device 100 representing a new type of (nearly) analog memory because of the information being coded into the mean value of the Bernoulli sequence resulting from the MTJ's stochastic fluctuation, where the stochastic fluctuations of the MTJ 160 corresponds to the domain wall's position in the base layer 110, or even more generally, to a given magnetic configuration (such as the number of skyrmions or other non-uniform magnetic textures present in the base layer 110).

As discussed herein, the domain wall position or the magnetic configuration of the base layer 110 can be controlled by current injection into the magnetic base layer 110 from the power supply 302. This allows for complete electrical separation of the control circuit path from that of the MTJ sensing. It can be convenient that the base layer 110 and MTJ 160 share the same ground, though in principle this is not necessary, because the magnetic separation between MTJ and base-metal can be insulating (i.e., the intervening layer 112 can be a poor conductor). Further, this option for substantial insulation between MTJ 160 and the domain wall base metal layer 110 mitigates a potential problem for integrated MTJ resistive read-out which subjects the delicate tunnel barrier layer 116 to possibly large spread voltage during control current injection into the domain wall base layer.

According to embodiments of the invention, the magnetic device 100 can be used as the matrix-weight memory at each vertex of the input-output grid for neuromorphic "tensor-processor" type of circuits. The memory (stored in the base layer 110) can contain multiple digital levels and/or nearly analog depending on the domain wall positions achievable by the base layer 110. The switching of domain wall positions can be made symmetric for +/− increments. Furthermore, the information is read out (via circuitry 304) at each point as a digital signal, thereby making a more software-provisioning friendly architecture.

As further benefits of embodiments of the invention, the magnetic device 100 can be used as a controlled random number generator. The compact construction of MTJ 160 and its intrinsic randomness from superparamagnetism make it a low-power source for a well-defined Bernoulli sequence. The input terminal 180 allows current control of the statistical nature (i.e., mean value) of the Bernoulli sequence. Unlike using spin-torque-current to control stochasticity of an MTJ, embodiments of the invention require no current to maintain the statistical property of the MTJ, thereby reducing power consumption needs of the magnetic device 100.

The functionalities of power supply 302, measurement circuitry 304, and controller 306 can be designed into a circuit system by those skilled in the art to be low-level circuit blocks and repeated on a cell-to-cell basis (a low level cell being one encompassing element/device 100 in its basic 3-terminal form), or to be shared among several different cells of the type of 100, similar in the design of MRAM cells and/or neuromorphic accelerator circuits for large-vector matrix operations.

Additionally, in some examples, the power supply 302, measurement circuitry 304, and controller 306 can be implemented modules. The various components, modules, engines, etc., described in the system 300 in FIG. 3 can be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein can be a combination of hardware and programming. The programming can be processor executable instructions stored on a tangible memory, and the hardware can include processing circuitry for executing those instructions. Thus, a system memory can store program instructions that when executed by processing circuitry implement the engines described herein. Other engines can also be utilized to include other features and functionality described in other examples herein. Alternatively or additionally, the processors and/or modules can include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein.

Figure 5:
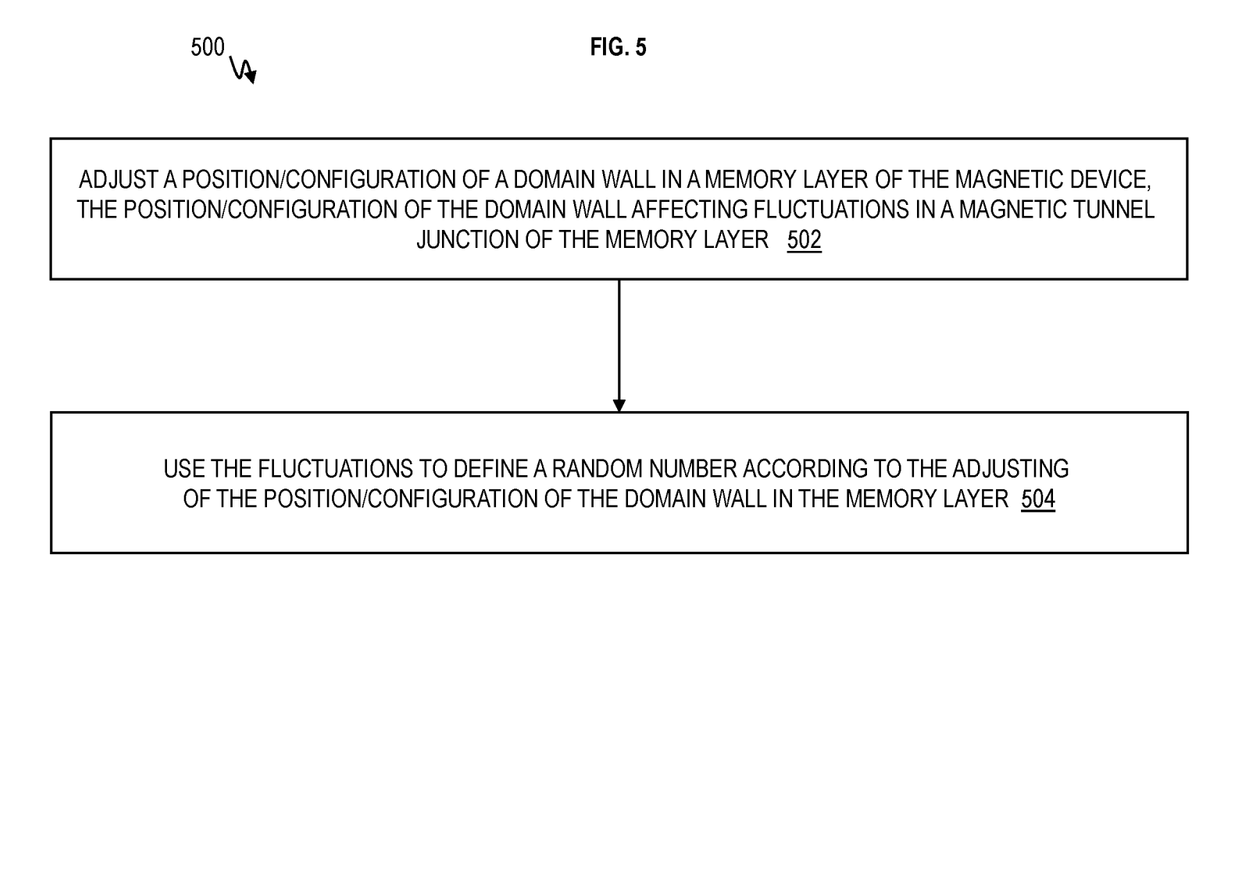
FIG. 5 depicts a flow chart of a method for controlling a magnetic device according to embodiments of the invention.

FIG. 5 depicts a flow chart of a method 500 (automatic/computer implemented) of controlling a magnetic device 100. At block 502, the method 500 includes adjusting a position/configuration of a domain wall 120 in a memory layer 110 of the magnetic device 100, the position/configuration of the domain wall 120 affecting stochastic fluctuations (e.g., of the free magnetic layer 114) in a magnetic tunnel junction 160 of the magnetic device 100. The method 500 includes using the stochastic fluctuations to define a random number according to the adjusting of the position/configuration of the domain wall 120 in the memory layer 110 at block 504.

The magnetic device is operable under its superparamagnetic state, and assumes a stochastic time-dependent state without requiring an external circuit to maintain the stochastic time-dependent state. The position/configuration of the domain wall (e.g., along the x-axis) includes/represents analog storage of information, the position/configuration being encoded in a stochastic average of the stochastic fluctuations. The stochastic fluctuations define and can be read out as a digital bit stream (from output terminal 182). The stochastic fluctuations include ones and zeros of a digital bit stream (e.g., as determined by the controller 306 according to the random measurements of high resistance values and low resistance value via measurement circuit 304), thereby forming a stochastic digital bit stream of a Bernoulli sequence.

The magnetic tunnel junction 160 includes a tunnel barrier layer 116 sandwiched by a reference magnetic layer 118 and a free magnetic layer 114. An effective magnetic field from the memory layer 110 is affected by adjustments to the position/configuration of the domain wall 120. The stochastic fluctuations include thermal fluctuations in time defining a fluctuating state of a magnetic moment in a free magnetic layer 114, the magnetic moment being affected by changes in a magnetic field of the memory layer 110, and a mean position of the stochastic fluctuations is influenced by the configuration of the memory layer 110. The free magnetic layer 114 includes material defined by superparamagnetism. The free magnetic layer 114 includes a magnetic element that is structured to operate in a superparamagnetic state. The free magnetic layer 114 of the magnetic tunnel junction 160 is positioned to receive magnetic interactions from the memory layer 110.

Figure 6:
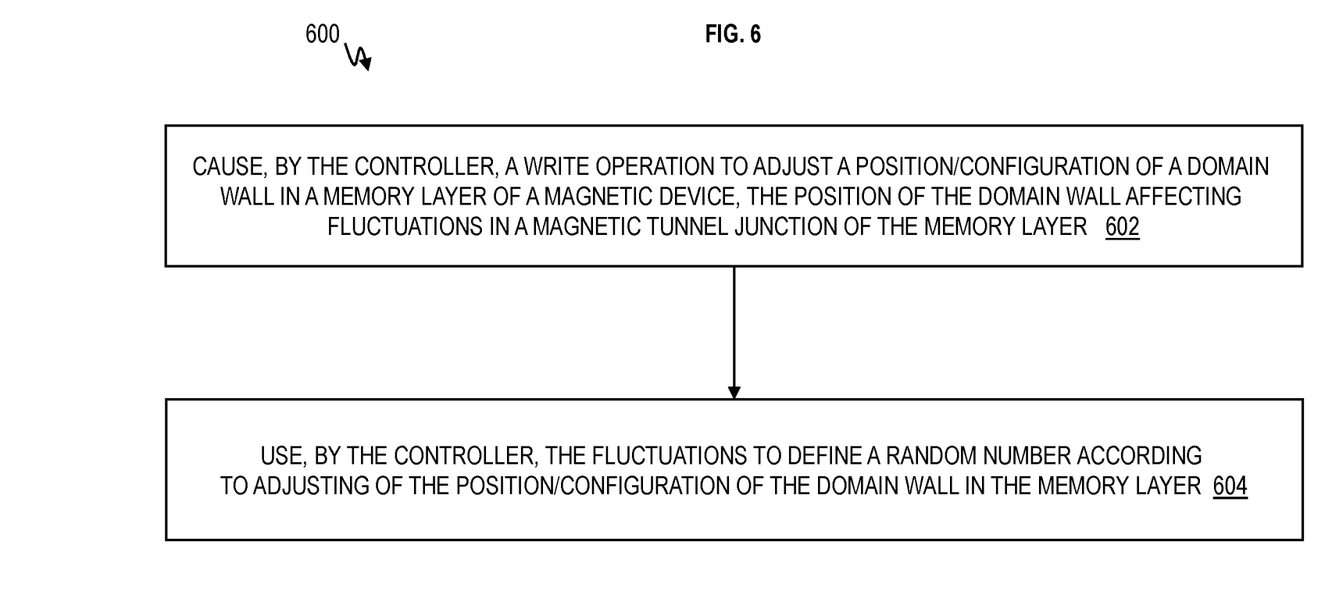
FIG. 6 depicts a flow chart of a method for a controller according to embodiments of the invention.

FIG. 6 depicts a flow chart of a method 600 (automatic/computer implemented) for operating a controller 306 according to embodiments of the invention. At block 602, the controller 306 is configured to cause a write operation to adjust a position/configuration of a domain wall 120 in a memory layer 110 of a magnetic device 100, the position/configuration of the domain wall 120 affecting stochastic fluctuations in a magnetic tunnel junction 160 of the magnetic device 100. At block 604, the controller 306 is configured to use statistical properties of the stochastic fluctuations in a time sequence to define a physical number (i.e., a sequence of 1s and 0s) according to adjusting of the position/configuration of the domain wall 120 in the memory layer 110 (along the x-axis). The controller 306 is configured to determine a stochastic average of the stochastic fluctuations to be a multi-bit, nearly or substantially analog value encoded in the position/configuration of the domain wall 120. The position/configuration of the domain wall 120 includes multi-bit, nearly or substantially analog values of information, the position/configuration being represented by an average of the stochastic fluctuations of a read-out.

Figure 7:
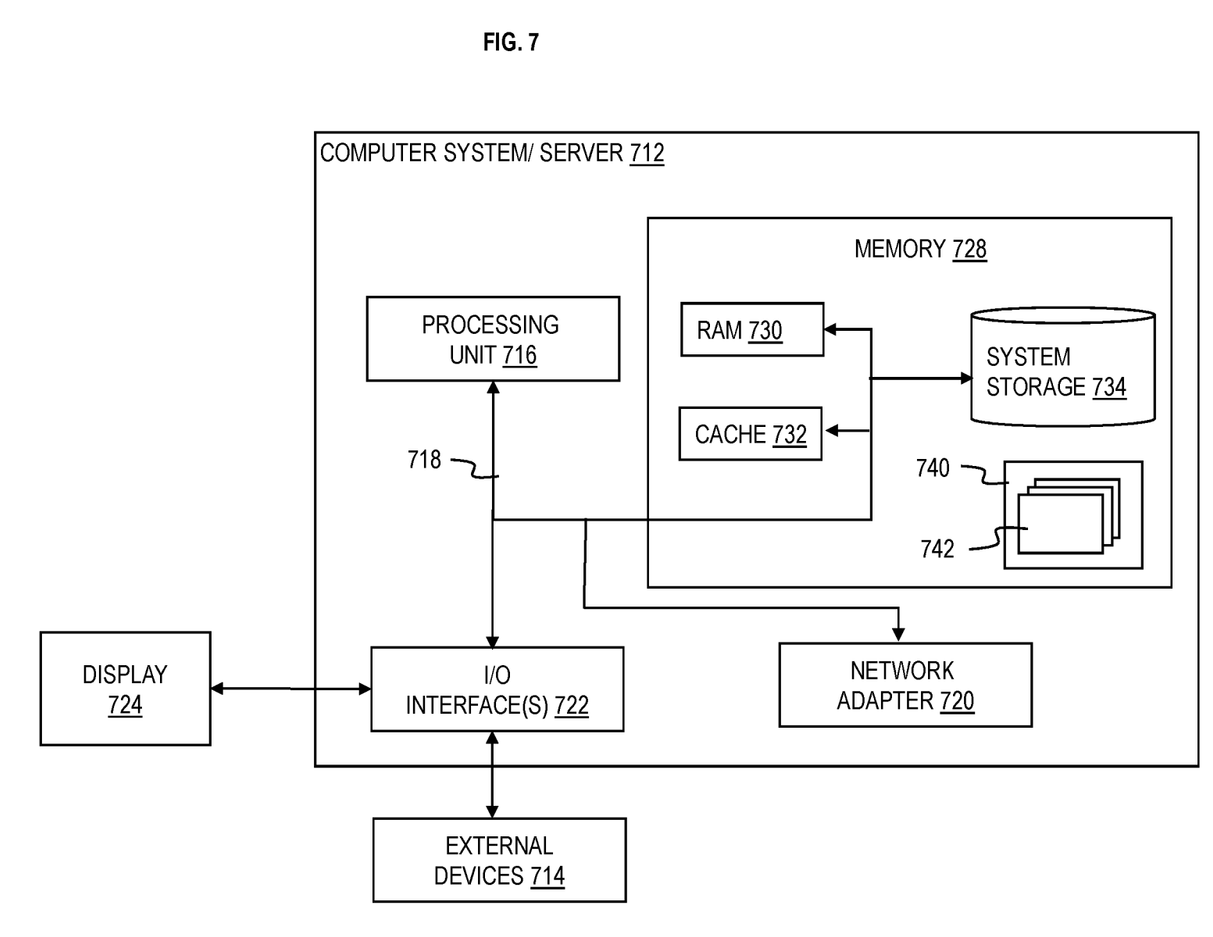
FIG. 7 depicts a schematic of an example computing system according to embodiments of the present invention.

FIG. 7 depicts a schematic of an example computing system 712 according to embodiments of the present invention. The computer system/server 712 can be operational with numerous other general purpose or special purpose computing system environments or configurations. The functions and capabilities of computing system 712 can be utilized in FIGS. 1-6 to implement elements and functions of the power supply 302, measurement circuitry 304, controller 306, etc., according to embodiments of the invention. One or more elements of the computing system 712 can be utilized to implement one or more elements of the modules.

Examples of well-known computing systems, environments, and/or configurations that can be representative of and/or include elements of computer system/server 712 include, but are not limited to, personal computer systems, phones (e.g., cellphones, smart phones, etc.), server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 712 can be described in the general context of computer system-executable instructions, such as program modules, being executed by a computer system. Generally, program modules can include routines, programs, objects, components, logic, data structures, and so on that perform particular tasks or implement particular abstract data types. Computer system/server 712 can be practiced in distributed cloud computing environments where tasks are performed by remote processing devices that are linked through a communications network. In a distributed cloud computing environment, program modules can be located in both local and remote computer system storage media including memory storage devices.

The components of computer system/server 712 can include, but are not limited to, one or more processors or processing units 716, a system memory 728, and a bus 718 that couples various system components including system memory 728 to processor 716. Bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 712 typically includes a variety of computer system readable media. Such media can be any available media that is accessible by computer system/server 712, and it includes both volatile and non-volatile media, removable and non-removable media. The system memory 728 can include computer system readable media in the form of volatile memory, such as random access memory (RAM) 730 and/or cache memory 732. Computer system/server 712 can further include other removable/non-removable, volatile/non-volatile computer system storage media. By way of example only, storage system 734 can be provided for reading from and writing to a nonremovable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 718 by one or more data media interfaces. Memory 728 can include at least one program product having a set (e.g., at least one) of program modules that are configured to carry out the functions of embodiments of the invention.

Program/utility 740, having a set (at least one) of program modules 742, can be stored in memory 728 by way of example, and not limitation, as well as an operating system, one or more application programs, other program modules, and program data. Each of the operating system, one or more application programs, other program modules, and program data or some combination thereof, can include an implementation of a networking environment. Program modules 742 generally carry out the functions and/or methodologies of embodiments of the invention as described herein.

Computer system/server 712 can also communicate with one or more external devices 714 such as a keyboard, a pointing device, a display 724, etc.; one or more devices that enable a user to interact with computer system/server 712; and/or any devices (e.g., network card, modem, etc.) that enable computer system/server 712 to communicate with one or more other computing devices. Such communication can occur via Input/Output (IO) interfaces 722. Still yet, computer system/server 712 can communicate with one or more networks such as a local area network (LAN), a general wide area network (WAN), and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples, include but are not limited to: microcode, device drivers, redundant processing units, external disk drive arrays, RAID systems, tape drives, and data archival storage systems, etc.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of controlling a magnetic device, the method comprising:
    adjusting a configuration in a memory layer of the magnetic device, the configuration affecting stochastic fluctuations of a magnetic moment in a free magnetic layer of a magnetic tunnel junction coupled to the memory layer, the magnetic tunnel junction comprising a reference magnetic layer having a fixed magnetic moment in a fixed magnetic direction; and
    using the stochastic fluctuations to define a random number according to the configuration in the memory layer.

2. The method of claim 1, wherein the magnetic device is operable under a superparamagnetic state and assumes a stochastic time-dependent state without requiring an external circuit to maintain the stochastic time-dependent state.

3. The method of claim 1, wherein the configuration comprises analog storage of information, the configuration being encoded in a stochastic average of the stochastic fluctuations.

4. The method of claim 1, wherein the stochastic fluctuations are read out as a digital bit stream.

5. The method of claim 1, wherein the stochastic fluctuations comprise ones and zeros of a digital bit stream forming a stochastic digital bit stream of a Bernoulli sequence.

6. The method of claim 1, wherein the magnetic tunnel junction comprises a tunnel barrier layer sandwiched by the reference magnetic layer and the free magnetic layer.

7. The method of claim 1, wherein an effective magnetic field from the memory layer on the free magnetic layer of the magnetic tunnel junction can be changed by adjustments to the configuration of the memory layer.

8. The method of claim 1, wherein:
    the stochastic fluctuations comprise thermal fluctuations in time to define a fluctuating state of the magnetic moment in the free magnetic layer; and
    a mean position of the stochastic fluctuations is influenced by the configuration of the memory layer.

9. The method of claim 1, wherein the free magnetic layer of the magnetic tunnel junction comprises a magnetic element that is structured to operate in a superparamagnetic state.

10. The method of claim 1, wherein the free magnetic layer of the magnetic tunnel junction is positioned to receive magnetic interactions from the memory layer.

11. A method for operating a controller, the method comprising:
    causing, by the controller, a write operation to adjust a configuration of a memory layer of a magnetic device, the configuration affecting stochastic fluctuations of a magnetic moment in a free magnetic layer of a magnetic tunnel junction of the magnetic device, the magnetic tunnel junction comprising a reference magnetic layer having a fixed magnetic moment in a fixed magnetic direction; and
    using, by the controller, statistical properties of the stochastic fluctuations in a time sequence to define a physical number according to the configuration in the memory layer.

12. The method of claim 11 further comprising determining a stochastic average of the stochastic fluctuations to be a multi-bit, substantially analog value encoded in the configuration.

13. The method of claim 11, wherein the configuration comprises multi-bit, substantially analog values of information, the configuration being represented by an average of the stochastic fluctuations of a read-out.

14. The method of claim 11, wherein the stochastic fluctuations define a digital bit stream.

15. The method of claim 11, wherein the stochastic fluctuations comprise ones and zeros of a digital bit stream.

16. The method of claim 11, wherein the magnetic tunnel junction comprises a tunnel barrier layer sandwiched by the reference magnetic layer and the free magnetic layer.

17. The method of claim 11, wherein an effective magnetic field from the memory layer on the free magnetic layer of the magnetic tunnel junction can be changed by adjustments to the configuration of the memory layer.

18. The method of claim 11, wherein:
the stochastic fluctuations comprise thermal fluctuations in time to define a fluctuating state of a magnetic moment in the free magnetic layer; and
a mean position of the stochastic fluctuations is influenced by the configuration of the memory layer.

19. The method of claim 11, wherein the free magnetic layer of the magnetic tunnel junction comprises a magnetic element that is structured to operate in a superparamagnetic state.

20. The method of claim 11, wherein the free magnetic layer of the magnetic tunnel junction is positioned to receive magnetic interactions from the memory layer.

\* \* \* \* \*